US012805329B2

(12) United States Patent
Hsu et al.

(10) Patent No.: US 12,805,329 B2
(45) Date of Patent: Nov. 17, 2026

(54) ELECTRONIC DEVICE PACKAGE AND METHOD OF MANUFACTURING THE SAME

(71) Applicant: Advanced Semiconductor Engineering, Inc., Kaohsiung (TW)

(72) Inventors: En Hao Hsu, Kaohsiung (TW); Kuo Hwa Tzeng, Kaohsiung (TW); Chia-Pin Chen, Kaohsiung (TW); Chi Long Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 304 days.

(21) Appl. No.: 18/761,075

(22) Filed: Jul. 1, 2024

(65) Prior Publication Data

US 2024/0355763 A1 Oct. 24, 2024

Related U.S. Application Data

(63) Continuation of application No. 17/500,920, filed on Oct. 13, 2021, now Pat. No. 12,027,469.

(51) Int. Cl.

| | |
|---|---|
| ***H10W 42/00*** | (2026.01) |
| ***H10W 70/656*** | (2026.01) |
| ***H10W 72/20*** | (2026.01) |
| ***H10W 72/90*** | (2026.01) |
| ***H10W 74/10*** | (2026.01) |
| ***H10W 76/40*** | (2026.01) |

(52) U.S. Cl.

CPC ......... *H10W 42/121* (2026.01); *H10W 72/90* (2026.01); *H10W 74/111* (2026.01); *H10W 76/40* (2026.01); *H10W 70/656* (2026.01); *H10W 72/234* (2026.01); *H10W 72/981* (2026.01)

(58) Field of Classification Search

CPC .................................................. H10W 42/121

See application file for complete search history.

(56) References Cited

U.S. PATENT DOCUMENTS

| | | | | |
|---|---|---|---|---|
| 6,020,648 | A | 2/2000 | MacPherson | |
| 6,107,164 | A | 8/2000 | Ohuchi | |
| 2011/0156240 | A1 | 6/2011 | Luan et al. | |
| 2022/0367306 | A1 * | 11/2022 | Chen ..................... | H10W 70/09 |

OTHER PUBLICATIONS

Non-Final Office Action for U.S. Appl. No. 17/500,920, issued Aug. 17, 2023, 9 pages.

Notice of Allowance for U.S. Appl. No. 17/500,920, issued Feb. 29, 2024, 8 pages.

* cited by examiner

*Primary Examiner* — William A Harriston

(74) *Attorney, Agent, or Firm* — Foley & Lardner LLP

(57) ABSTRACT

An electronic device package and manufacturing method thereof are provided. The electronic device package includes an electronic component including an active surface, a patterned conductive layer disposed on the active surface, an encapsulation layer disposed over the patterned conductive layer, and a buffer layer disposed between the patterned conductive layer and the encapsulation layer. The buffer layer is shaped and sized to alleviate a stress generated due to an interaction between the patterned conductive layer and the encapsulation layer.

20 Claims, 17 Drawing Sheets

ELECTRONIC DEVICE PACKAGE AND METHOD OF MANUFACTURING THE SAME

CROSS-REFERENCE TO RELATED APPLICATION

This application is a continuation of U.S. patent application Ser. No. 17/500,920, filed Oct. 13, 2021, now U.S. Pat. No. 12,027,469, the content of which is incorporated herein by reference in its entirety.

TECHNICAL FIELD

The present disclosure relates generally to electronic device packages and methods of manufacturing the same, and more particularly, to an electronic device package including a buffer layer between a redistribution layer and an encapsulation layer, and methods for manufacturing the same.

BACKGROUND

A conventional electronic device package suffers from delamination due to mismatch in material characteristics. Particularly, thermal stress occurs when different materials, such as molding compound and metal, undergo thermal cycles. The thermal stress leads to delamination issue, and therefore the reliability of a conventional electronic device package deteriorates.

SUMMARY

In some arrangements, an electronic device package includes an electronic component including an active surface, a patterned conductive layer disposed on the active surface, an encapsulation layer disposed over the patterned conductive layer, and a buffer layer disposed between the patterned conductive layer and the encapsulation layer. The buffer layer is shaped and sized to alleviate stress generated due to an interaction between the patterned conductive layer and the encapsulation layer.

In some arrangements, an electronic device package includes an electronic component including an active surface and an electrical terminal exposed form the active surface, a redistribution layer (RDL) disposed on the active surface, an encapsulation layer disposed on the RDL, and an interlayer disposed between the RDL and the encapsulation layer. An elastic modulus of the interlayer is less than an elastic modulus of the RDL and an elastic modulus of the encapsulation layer.

In some arrangements, an electronic device package includes an electronic component including an active surface, a patterned conductive layer disposed on the active surface, an encapsulation layer disposed over the patterned conductive layer, and an interlayer disposed between the patterned conductive layer and the encapsulation layer. The interlayer is shaped and sized to reduce a difference between a first thermal expansion of the patterned conductive layer and a second thermal expansion of the encapsulation under a change of temperature.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
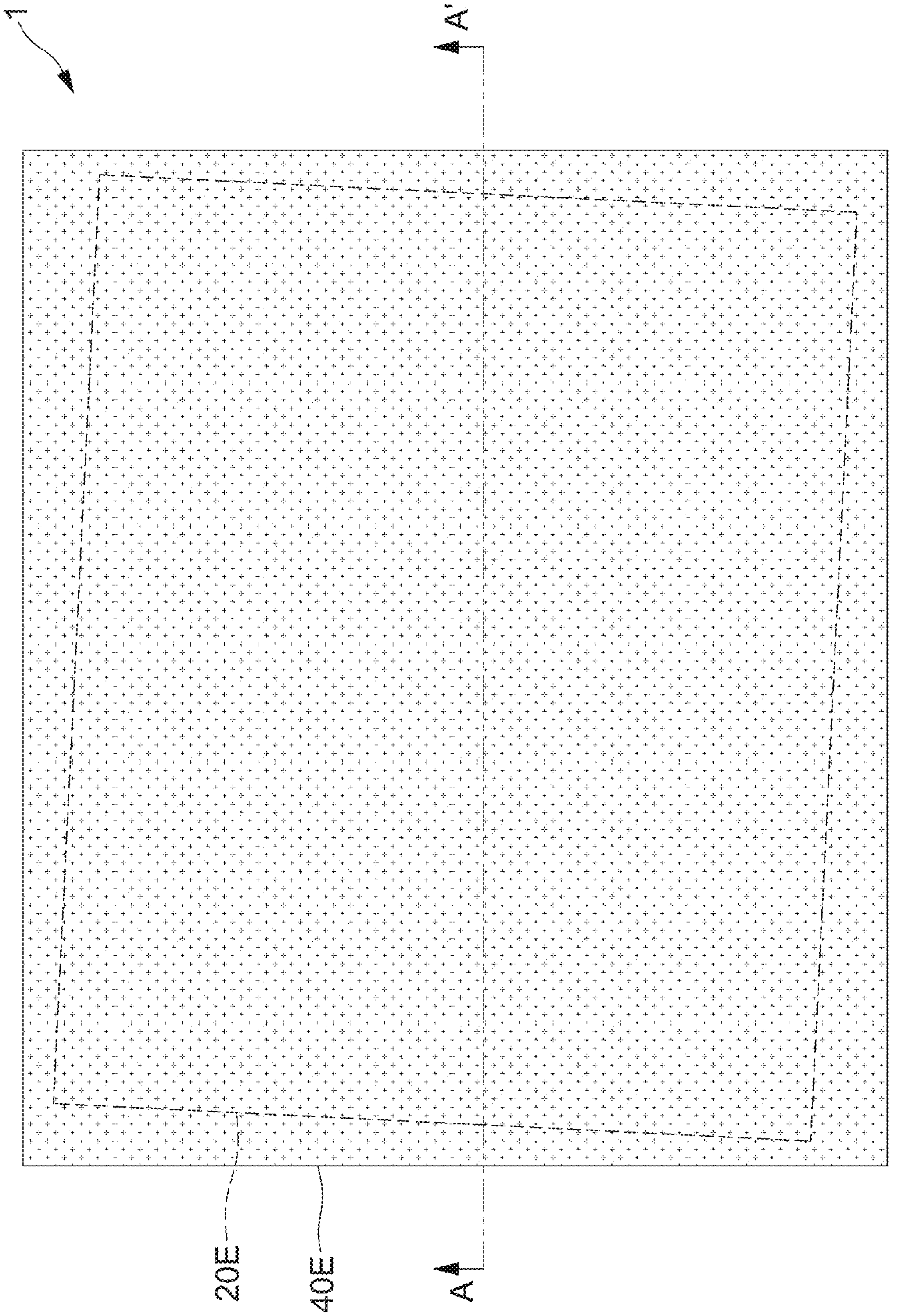
FIG. 1 is a schematic top view of an electronic device package in accordance with some arrangements of the present disclosure.

The following disclosure provides for many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various arrangements and/or configurations discussed.

Some arrangements, or examples, illustrated in the figures are disclosed below using specific language. It will nevertheless be understood that the arrangements and examples are not intended to be limiting. Any alterations and modifications of some of the disclosed arrangements, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various arrangements and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "active surface" may refer to a surface of an electronic component such as a semiconductor die on which electrical terminals such as contact pads, conductive studs or conductive pillars are disposed, for transmission of electrical signals or power. The term "inactive surface" may refer to another surface of the electronic component opposite to the active surface on which no contact terminals are disposed.

Figure 1A:
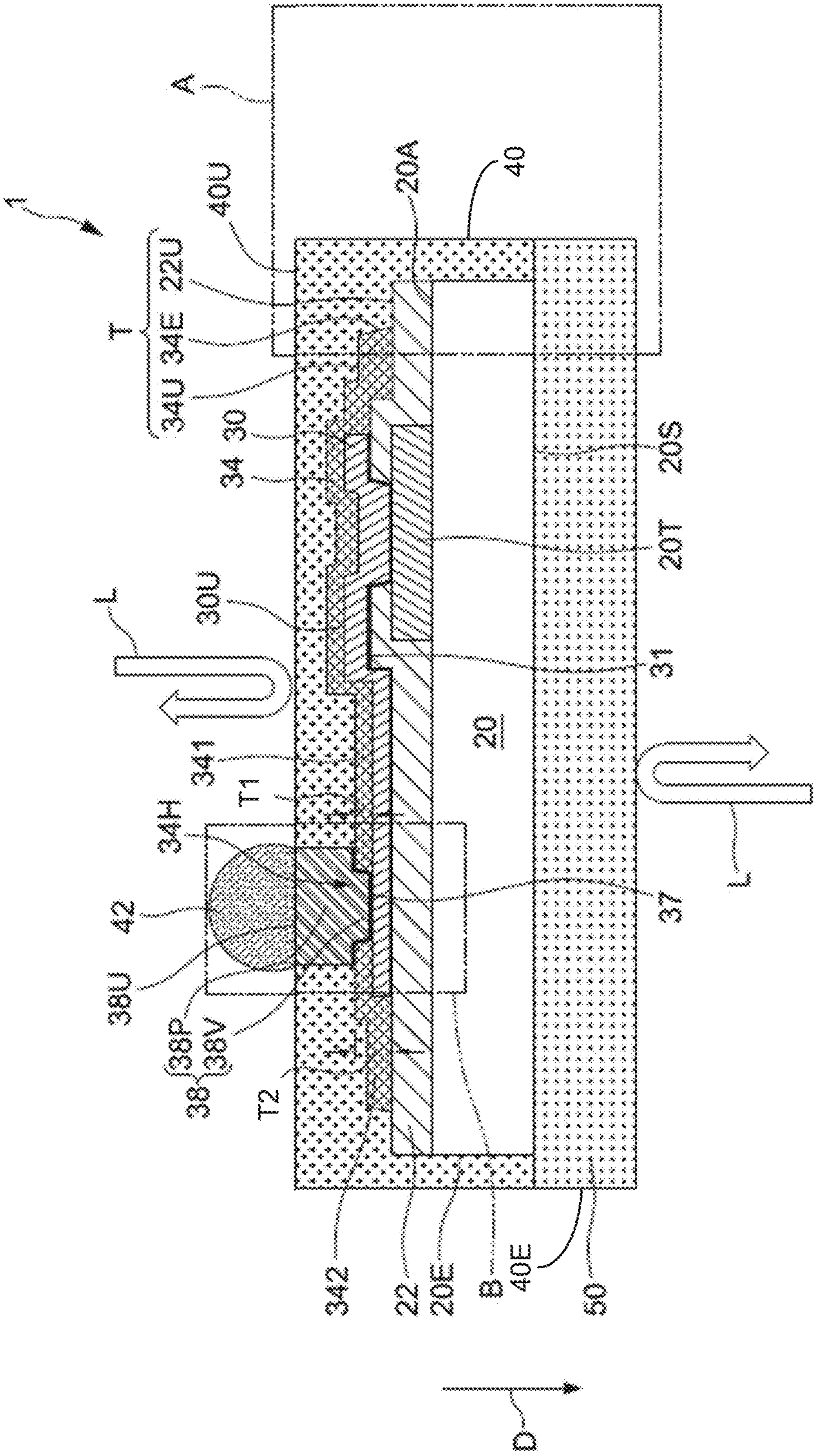
FIG. 1A is a schematic cross-sectional view of the electronic device package of FIG. 1 along a line A-A' in accordance with some arrangements of the present disclosure.
Figure 1C:
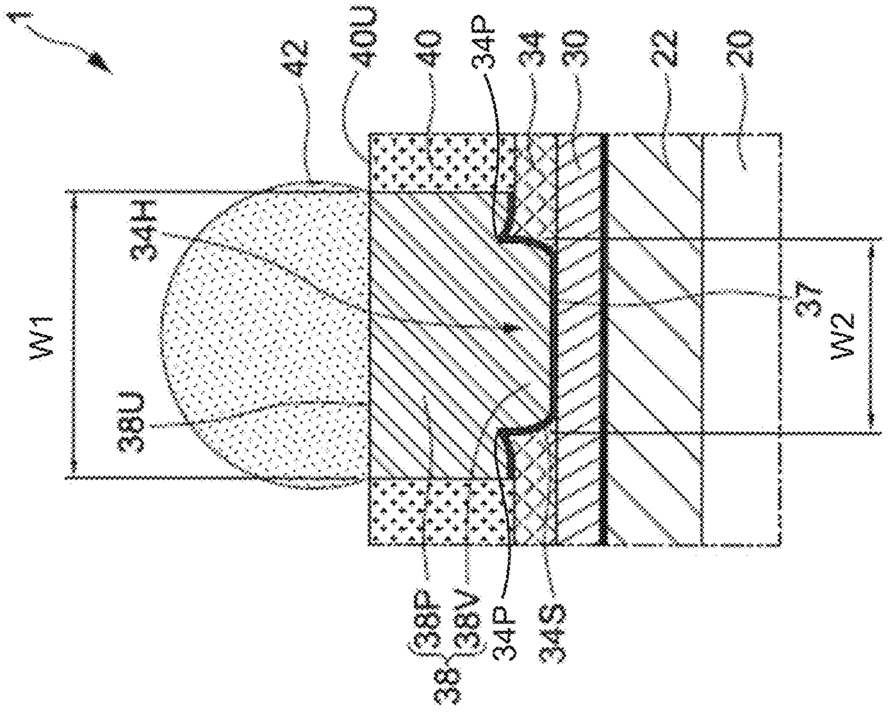
FIG. 1C is an enlarged view of a region "B" of the electronic device package in FIG. 1A.
Figure 1B:
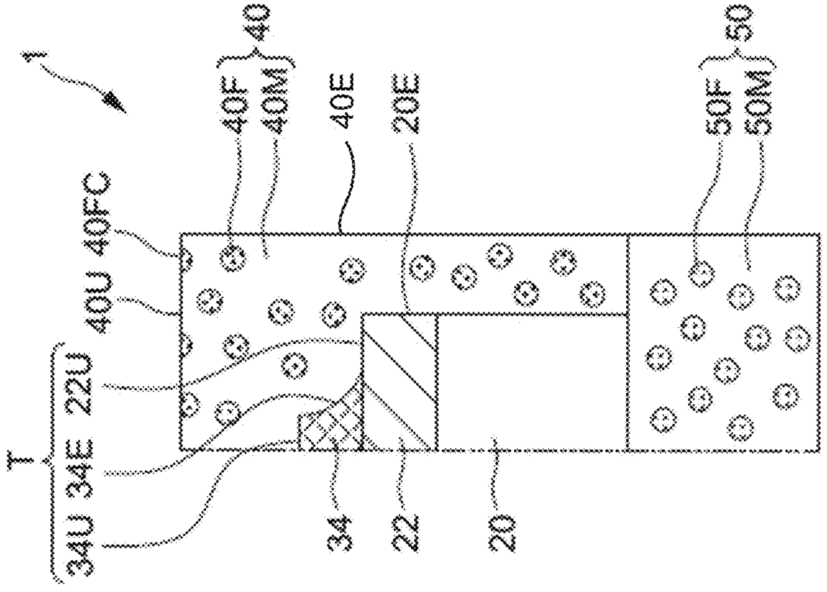
FIG. 1B is an enlarged view of a region "A" of the electronic device package in FIG. 1A.

FIG. 1 is a schematic top view of an electronic device package 1 in accordance with some arrangements of the present disclosure. FIG. 1A is a schematic cross-sectional view of the electronic device package 1 of FIG. 1 along a line A-A' in accordance with some arrangements of the present disclosure. FIG. 1B is an enlarged view of a region "A" of the electronic device package 1 in FIG. 1A. FIG. 1C is an enlarged view of a region "B" of the electronic device package 1 in FIG. 1A.

As shown in FIG. 1, FIG. 1A, FIG. 1B and FIG. 1C, the electronic device package 1 includes at least an electronic component 20, a passivation layer 22, a patterned conductive layer such as a redistribution layer (RDL) 30, an interlayer 34, an interconnection structure 38 and an encapsulation layer 40. The electronic component 20 includes an active surface 20A, and an electrical terminal 20T exposed form the active surface 20A. In some arrangements, the electronic component 20 may include an active electronic component such as a semiconductor die. By way of an example, the electronic component 20 may include, but is not limited to be, an optoelectronic component such as an optical sensor. The electrical terminal 20T may include a conductive pad such as aluminum pad or other suitable electrical terminal electrically connected to internal circuit (not shown in view) of the electronic component 20. The electronic component 20 may further include an opposing surface 20S opposite to the active surface 20A, and edges 20E connecting the active surface 20A to the opposing surface 20S. The opposing surface 20S may be or include, but is not limited to, an inactive surface.

The passivation layer 22 is disposed on and directly contacts the active surface 20A of the electronic component 20. The passivation layer 22 may include an inorganic insulating material, an organic insulating material, or a combination (e.g., a stack) thereof. The passivation layer 22 may further cover a portion of the electrical terminal 20T, and exposes another portion of the electrical terminal 20T through a hole defined by the passivation layer. As shown in FIG. 1A, the passivation layer 22 may cover at least a portion of an upper surface of the electrical terminal 20T, where the upper surface of the electrical terminal 20T faces away from the electronic component 20. The passivation layer 22 may also cover lateral surfaces of the electrical terminal 20T that extends between the upper surface and a lower surface of the electrical terminal 20T, where the lower surface faces the electronic component 20 and contacts the active surface 20A. The portion of the passivation layer 22 that covers the portion of the upper surface of the electrical terminal 20T defines the hole through which the electrical terminal 20T (e.g., another portion of the upper surface of the electrical terminal 20T) is exposed. In some arrangements, the upper surface 22U of the passivation layer 22 may be substantially conformal with the active surface 20A and the electrical terminal 20T.

In some arrangements, the patterned conductive layer may include, but is not limited to be, an RDL 30. The RDL 30 is disposed on at least a portion of the upper surface 22U of the passivation layer 22, and electrically connected to the electrical terminal 20T via the hole defined by the passivation layer 22. The RDL 30 is disposed on the active surface 20A. A portion of the RDL 30 contacts the electrical terminal 20T via the hole defined by the passivation layer 22. Another portion of the RDL 30 laterally extends beyond the electrical terminal 20T. In other words, another portion of the RDL 30 extends past in a horizontal dimension (substantially parallel to the surface 20A and perpendicular to the direction D) beyond the hole of the passivation layer 22. In some arrangements, the RDL 30 may include a conductive via located in the hole of the passivation layer 22. The conductive via of the RDL 30 electrically connects the electrical terminal 20T through the hole of the passivation layer 22. In some examples, a conductive trace electrically connects to the conductive via at one end. The conductive trace may be routed over the electronic component 20, and the other end of the conductive trace is configured to (e.g., shaped to, sized to, and/or is formed of a material for) receive the interconnection structure 38. In some arrangements, the RDL 30 is a fan-in circuit, and the RDL 30 is disposed within the boundary of the electronic component 20 defined by the edge 20E. That is, the RDL 30 does not extend in a horizontal axis parallel to the surface 20A past the edges 20E of the electronic component 20. The horizontal axis is substantially perpendicular to the direction D. The RDL 30 may include a single-layered RDL or a multi-layered RDL. The RDL 30 may include an upper surface 30U. A portion of the upper surface 30U of the RDL 30 may be conformal, substantially conformal, parallel, or substantially parallel with a portion of the upper surface 22U of the passivation layer 22. The RDL 30 may partially expose the upper surface 22U of the passivation layer 22. As shown, both end portions of the upper surface 22U extend further along the horizontal axis parallel to the surface 20A than the end portions of the RDL 30. In some arrangements, the material of the RDL 30 may include metal such as copper, and the RDL 30 may be formed by electroplating. A seed layer 31 such as a Ti/Cu layer may be disposed between the RDL 30 and the passivation layer 22, and is configured to grow the RDL 30.

The interlayer 34 covers at least a portion of the RDL 30 and at least a portion of the passivation layer 22. The interlayer 34 may cover or encapsulate at least a portion of the RDL 30. In some arrangements, the interlayer 34 includes an upper surface 34U, and an edge 34E. The edge 34E may be a lateral surface of the interlayer 34. The interlayer 34 may be substantially conformal with the RDL 30. A portion of the upper surface 34U of the interlayer 34 may be conformal, substantially conformal, parallel, or substantially parallel with a portion of the upper surface 30U of the RDL 30 and a portion of an upper surface 22U of the passivation layer 22. In some arrangements, the interlayer 34 may include a first portion 341 covering the RDL 30, and a second portion 342 covering the passivation layer 22. The RDL 30 is between the first portion 341 and the passivation layer 22. The RDL 30, the seed layer 31, and the passivation layer 22 are between the first portion 341 and the electronic component 20. On the other hand, the RDL 30 is not between the second portion 342 and the passivation layer 22. The second portion 342 directly contacts the passivation layer 22. The passivation layer 22 is between the second portion 342 and the electronic component 20. The first thickness T1 of the first portion 341 may be less than the second thickness T2 of the second portion 342. By way of an example, the first thickness T1 of the first portion 341 may be ranged from about 3 micrometers to about 4 micrometers, and the second thickness T2 of the second portion 342 may be ranged from about 7 micrometers to about 8 micrometers. In some arrangements, the upper surface 34U and the edge 34E of the interlayer 34 and the upper surface 22U of the passivation layer 22 collectively define a step T as illustrated in FIGS. 1A and 1B.

The interlayer 34 includes or defines an opening 34H partially exposing a portion of the RDL 30. The interconnection structure 38 is disposed on the interlayer 34 and electrically connected to the RDL 30 through the opening 34H of the interlayer 34. In some arrangements, the opening 34H of the interlayer 34 includes a sidewall 34S tapering in a direction D from the interconnection structure 38 toward the RDL 30. The direction D is substantially perpendicular to one or more of the surfaces 20A, 22U, 34U, or 38U. The aperture of the opening 34H closer to the electrical conductor 42 is larger than the aperture of the opening 34H closer to the electronic component 20. In some arrangements, the sidewall 34S of the opening 34H of the interlayer 34 includes a curved surface as shown in FIG. 1C. In some arrangements, the interlayer 34 may include a protrusion 34P disposed between the upper surface 34U of the interlayer 34 and the sidewall 34S of the opening 34H. The protrusion 34P protrudes out from the upper surface 34U of the interlayer 34 in a direction away from the electronic component 20 and toward the electrical conductor 42. In some arrangements, the material of the interlayer 34 may include photo-curable dielectric material, which can be patterned by photolithography process. By way of an example, the material of the interlayer 34 may include an organic material such as polyimide. The interconnection structure 38 extends toward the interlayer 34, and passes through the interlayer 34 (e.g., the opening 34H). A portion of the interlayer 34 may further extend between the interconnection structure 38 and the RDL 30.

The interconnection structure 38 may include, but is not limited to be, a conductive structure. The interconnection structure 38 may include a conductive stud such as a copper stud. In some arrangements, the interconnection structure 38 includes a via portion 38V in the opening 34H of the interlayer 34. The via portion 38V is connected to the RDL 30. The interconnection structure 38 further includes a pad portion 38P having at least a portion disposed on the upper surface 34U of the interlayer 34. The pad portion 38P is connected to the via portion 38V. The first width W1 of the pad portion 38P is wider than the second width W2 of the via portion 38V as shown in FIG. 1C. A portion of the interlayer 34 may be further disposed between the pad portion 38P of the interconnection structure 38 and the RDL 30.

In some arrangements, the material of the interconnection structure 38 may include metal such as copper, and the interconnection structure 38 may be formed by electroplating. A seed layer 37 such as a Ti/Cu layer may be disposed between the interconnection structure 38 and the RDL 30/the interlayer 34. The seed layer 37 is configured to grow the interconnection structure 38.

The encapsulation layer 40 is disposed on and directly contact at least a portion of the interlayer 34. The interlayer 34 is interposed between the RDL 30 and the encapsulation layer 40. The interlayer 34 may be further interposed between the interconnection structure 38 and the encapsulation layer 40. The interlayer 34 is configured to (e.g., shaped to, sized to, and/or is formed of a material to) alleviate delamination between the encapsulation layer 40 and the RDL 30 and/or between the interconnection structure 38 and the encapsulation layer 40 due to stress such as thermal stress during thermal cycle test. In other words, the interlayer 34 alleviates delamination in the manner disclosed herein by virtue of the size, shape, and material of the interlayer 34. In some arrangements, the elastic modulus of the interlayer 34 is less than the elastic modulus of the RDL 30, and the elastic modulus of the interlayer 34 is less than the elastic modulus of the encapsulation layer 40, such that the stress generated due to an interaction between the encapsulation layer 40 and the RDL 30 and/or the interconnection structure 38 and the encapsulation layer 40 can be alleviated. Accordingly, delamination can be reduced.

In some arrangements, the interlayer 34 is configured to (e.g., shaped to, sized to, and/or is formed of a material to) reduce a difference between thermal expansion of the RDL 30 and thermal expansion of the encapsulation layer 40 under a change of temperature. The thermal expansion may refer to a change of volume, a change of length, and/or a change of area under a change of temperature. The thermal expansion may be expressed by a positive value (indicating an increase of a volume, a length, and/or an area) or a negative value (indicating a decrease of a volume, a length, and/or an area). In some arrangements, the thermal expansion (e.g., a volume change) of the RDL 30 is greater than the thermal expansion (e.g., a volume change) of the encapsulation layer 40 under the change of temperature. In some arrangements, the change of temperature is from about −55° C. to about 150° C. In some arrangements, the change of temperature includes undergoing a plurality of thermal cycles. For example, the plurality of thermal cycles may include more than 2000 thermal cycles. In some arrangements, a coefficient of thermal expansion (CTE) of the interlayer 34 is between a CTE of the RDL 30 and a CTE of the encapsulation layer 40. In some arrangements, the RDL 30 is subject to a compressive stress exerted from the interlayer 34, and the CTE of the interlayer 34 is smaller than the CTE of the RDL 30. In some arrangements, the encapsulation layer 40 is subject to a tensile stress exerted from the interlayer 34, and the CTE of the interlayer 34 is greater than the CTE of the encapsulation layer 40. In some arrangements, the interlayer 34 may include, but is not limited to be, a buffer layer.

The encapsulation layer 40 may encapsulate the active surface 20A and the edges 20E of the electronic component. In some arrangements, the edge 34E of the interlayer 34 is recessed from the edge 20E of the electronic component 20, and the interlayer 34 exposes a portion of the upper surface 22U of the passivation layer. The edge 34E of the interlayer 34 may include a curved surface such as a concaved curved surface as shown in FIG. 1B. In some arrangements, the bottom portion of the edge 34E of the interlayer 34 (e.g., the portion closer to the passivation layer 22) is more distant than the upper portion of the edge 34E of the interlayer 34 (e.g., the portion closer to the surface 34U) from any point on the RDL 30. For example, the bottom portion of the edge 34E of the interlayer 34 may be wider than the upper portion of the edge 34E of the interlayer 34. The encapsulation layer 40 may directly contact the edge 34E of the interlayer 34. The encapsulation layer 40 may directly contact the edge 20E of the electronic component 20. The encapsulation layer 40 may include a molding material 40M and fillers 40F dispersed in the molding material 40M. The molding material 40M may include molding compound such as epoxy-based material (e.g. FR4, electronic molding compounds), resin-based material (e.g. Bismaleimide-Triazine (BT)), ABF, Polyimide (PI) or other suitable molding materials. The fillers 40F may include silicon oxide fillers. The molding material 40M and the fillers 40F may contact the edge 34E of the interlayer 34 and the portion of the upper surface 22U of the passivation layer 22. In some arrangements, the encapsulation layer 40 may be grinded during fabrication, and at least one of the fillers 40F may have a cutting plane 40FC exposed from the encapsulation layer 40. The cutting plane 40FC is substantially aligned or coplanar with an upper surface 40U of the encapsulation layer 40 and/or the upper surface 38U of the interconnection structure 38 as shown in FIG. 1B. As shown in FIG. 1, the edge 20E of the electronic component 20 and the respective edge 40E of the encapsulation layer 40 may be non-parallel. The non-parallel configuration may be caused due to shift of the electronic component 20. The shift may be caused due to alignment variation in disposing the electronic component 20 and/or push by mold flow in formation of the encapsulation layer 40.

In some arrangements, the encapsulation layer 40 is opaque to an energy beam L such as infrared (IR) beam or visible light. In some arrangements, the light transmittance of the encapsulation layer 40 is substantially less than 5%. By way of examples, the transmittance to the IR beam of the encapsulation layer 40 is substantially less than 5%. The non-transparency to the energy beam L can help to keep the electronic component 20 from being affected by the energy beam L. The encapsulation layer 40 may encapsulate the active surface 20A and the edges 20E of the electronic component 20, such that five sides including the active surface 20A and the edges 20E of the electronic component 20 can be shielded from the energy beam L.

The electronic device package 1 may further include a light shielding layer 50 disposed on or directly contacting the opposing surface 20S of the electronic component 20. In some arrangements, the light shielding layer 50 may be opaque to the energy beam L. The encapsulation layer 40 may be in direct contact with the light shielding layer 50. The light shielding layer 50 may include the molding material 50M and the fillers 50F dispersed in the molding material 50M. The molding material 50M may include molding compound such as epoxy-based material (e.g. FR4, electronic molding compounds), resin-based material (e.g. BT), ABF, PI or other suitable molding materials. The fillers 50F may include silicon oxide fillers as shown in FIG. 1B.

The encapsulation layer 40 may encapsulate the active surface 20A and the edges 20E of the electronic component 20, and the light shielding layer 50 may encapsulate the opposing surface 20S of the electronic component 20. Accordingly, the energy beam L from all sides including the active surface 20A, the edges 20E and the opposing surface 20S of the electronic component 20 can be shielded.

The encapsulation layer 40 may further encapsulate at least a portion of the interconnection structure 38, and partially expose an upper surface 38U of the interconnection structure 38. In some arrangements, the upper surface 40U of the encapsulation layer 40 and the upper surface 38U of the interconnection structure 38 are substantially aligned. In some arrangements, the upper surface 40U of the encapsulation layer 40 and the upper surface 38U of the interconnection structure 38 are substantially coplanar. In some arrangements, the pad portion 38P may be configured as a bonding pad.

In some arrangements, the electronic device package 1 may further include an electrical conductor 42 disposed on the upper surface 38U of the interconnection structure 38, and electrically connected to the interconnection structure 38. The electrical conductor 42 may include a solder conductor such as a solder ball as shown in FIGS. 1A and 1C.

The interlayer 34 is disposed between the RDL 30 and the interconnection structure 38 made of metal such as copper and between the RDL 30 and the encapsulation layer 40 made of molding compound. The interlayer 34 is configured to (e.g., shaped to, sized to, and/or is formed of a material to) alleviate delamination between the encapsulation layer 40 and the RDL 30 and/or between the interconnection structure 38 and the encapsulation layer 40 due to stress such as thermal stress. By way of examples, the elastic modulus of the interlayer 34 is less than the elastic modulus of the RDL 30, and the elastic modulus of the interlayer 34 is less than the elastic modulus of the encapsulation layer 40, such that the stress between the encapsulation layer 40 and the RDL 30 and/or the stress between interconnection structure 38 and the encapsulation layer 40 can be alleviated, absorbed, and/or buffered. According to experimental result, with the installation of the interlayer 34 between the RDL 30 and the encapsulation layer 40, the electronic device package 1 can pass over 2000 times thermal cycle tests. Accordingly, delamination risk can be reduced.

The electronic device package and manufacturing methods of the present disclosure are not limited to the above-described arrangements, and may be implemented according to other arrangements. To streamline the description and for the convenience of comparison between various arrangements of the present disclosure, similar components of the following arrangements are marked with same numerals, and may not be redundantly described.

Figure 2:
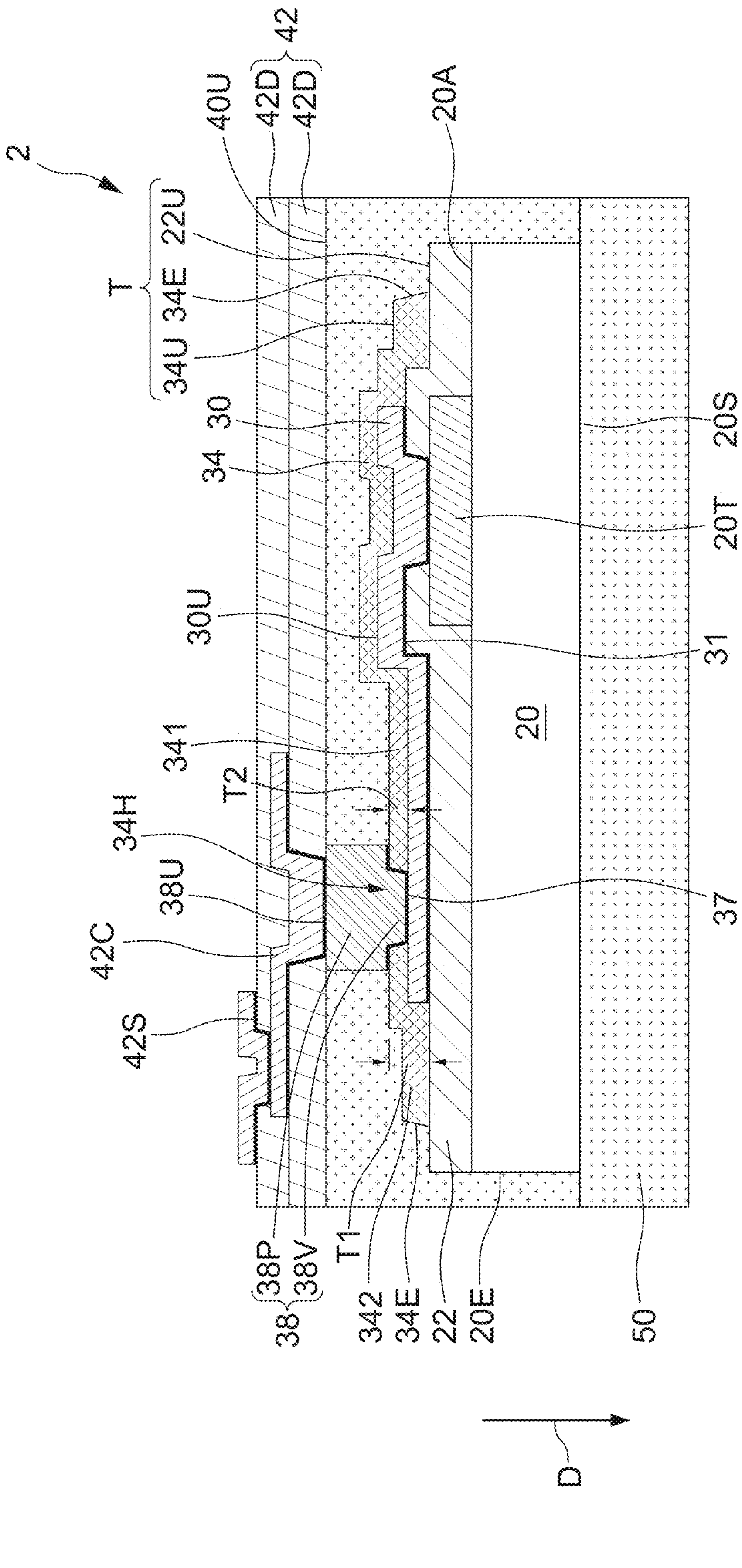
FIG. 2 is a schematic cross-sectional view of an electronic device package in accordance with some arrangements of the present disclosure.

FIG. 2 is a schematic cross-sectional view of an electronic device package 2 in accordance with some arrangements of the present disclosure. As shown in FIG. 2, in contrast to the electronic device package 1 of FIG. 1A, the electrical conductor 42 of the electronic device package 2 may be another RDL stacked on the patterned conductive layer. In some arrangements, the electrical conductor 42 may include one or more layers of conductive wirings 42C, and one or more dielectric layers 42D. The material of the conductive wirings 42C may include metal such as copper, and seed layer(s) 42S such as Ti/Cu layer(s) may be used to grow the conductive wirings 42C. The electrical conductor 42 may include a fan-out circuit, and the conductive wirings 42C may not extend beyond the boundary defined by the edges 20E of the electronic component 20. That is, the conductive wirings 42C does not extend in a horizontal axis parallel to the surface 20A past the edges 20E of the electronic component 20. The horizontal axis is substantially perpendicular to the direction D.

Figure 3:
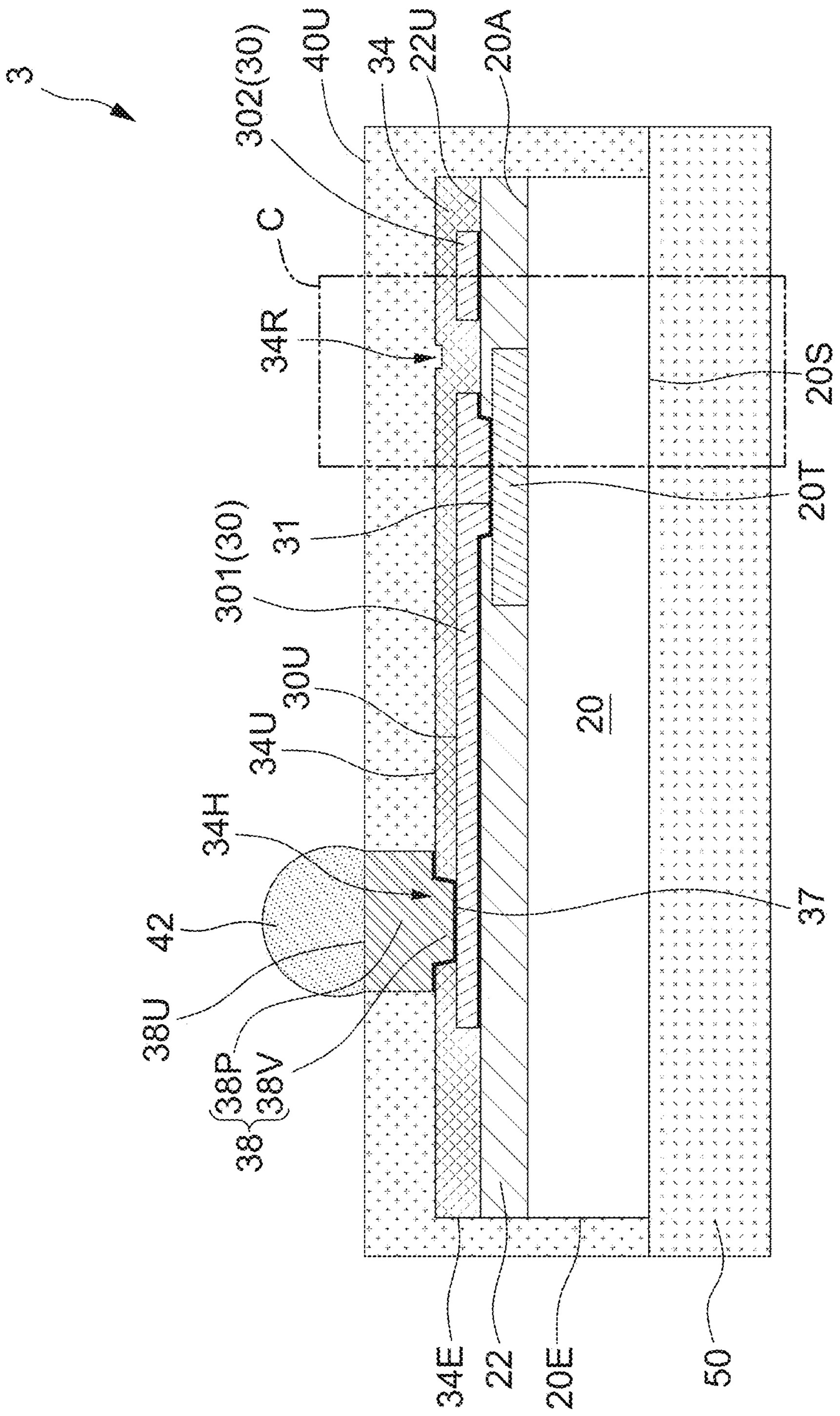
FIG. 3 is a schematic cross-sectional view of an electronic device package in accordance with some arrangements of the present disclosure.
Figure 3A:
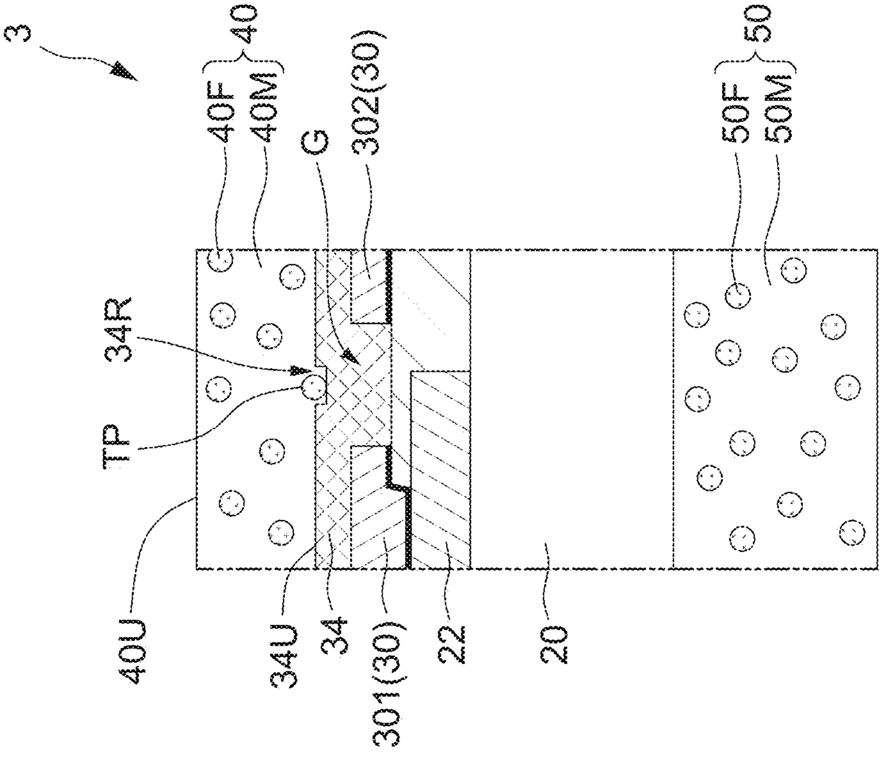
FIG. 3A is an enlarged view of a region "C" of the electronic device package in FIG. 3.

FIG. 3 is a schematic cross-sectional view of an electronic device package in accordance with some arrangements of the present disclosure, and FIG. 3A is an enlarged view of a region "C" of the electronic device package in FIG. 3.

As shown in FIG. 3, in contrast to the electronic device package 1 of FIG. 1A, the patterned conductive layer of the electronic device package 3 may include two conductive wirings 301 and 302 adjacent to each other, and spaced apart with a gap G between the conductive wirings 301 and 302. The conductive wirings 301 and 302 may be electrically connected to different electrical terminals (e.g., as shown the conductive wiring 301 is connected to electrical terminal 20T, and the conductive wiring 302 is connected to an electrical terminal not shown that is different from the electrical terminal 20T. The interlayer 34 disposed on the RDL 30 is substantially conformal with the RDL 30, and includes an indentation surface 34R recessed from the upper surface 34U of the interlayer 34. The indentation surface 34R is located above the gap G. The encapsulation layer 40 may extend and fill into the indentation surface 34R of the interlayer 34. One or more fillers 40F of the encapsulation layer 40 may fall into the indentation surface 34R and contact the indentation surface 34R. In some arrangements, the depth of the indentation surface 34R may be less than the height, thickness, or diameter of the filler 40F, such that a topmost point TP of the filler 40F contacting the indentation surface 34R of the interlayer 34 is higher than the upper surface 34U of the interlayer 34.

FIG. 4A, FIG. 4B, FIG. 4C, FIG. 4D, FIG. 4E, FIG. 4F, FIG. 4G, FIG. 4H, FIG. 4I, FIG. 4J and FIG. 4K illustrate operations of manufacturing an electronic device package in accordance with some arrangements of the present disclosure.

Figure 4A:
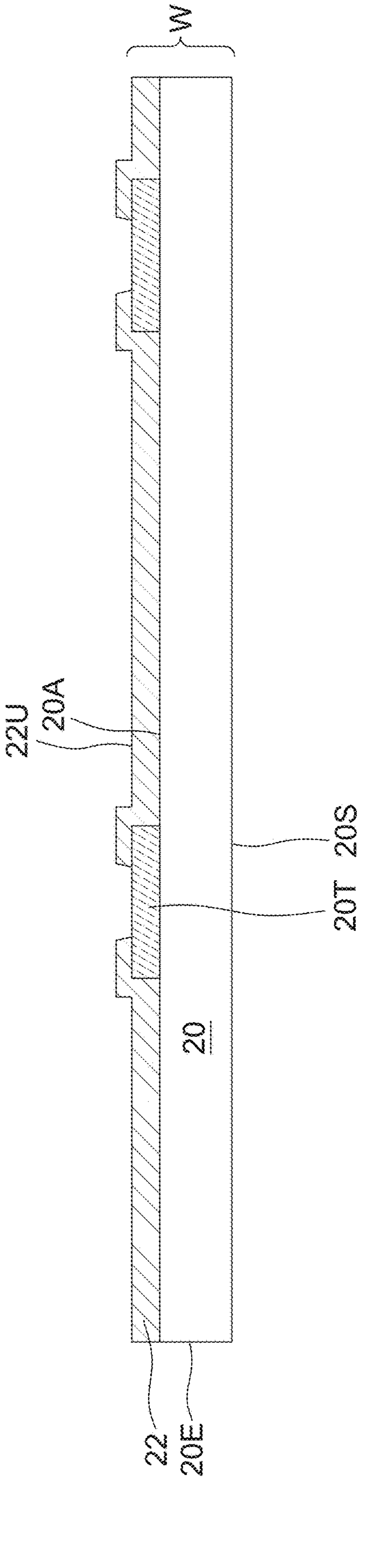
FIG. 4A, FIG. 4B, FIG. 4C, FIG. 4D, FIG. 4E, FIG. 4F, FIG. 4G, FIG. 4H, FIG. 4I, FIG. 4J and FIG. 4K illustrate operations of manufacturing an electronic device package in accordance with some arrangements of the present disclosure.

As shown in FIG. 4A, a plurality of electronic components 20 are provided on a substrate. In some arrangements, the substrate may include a wafer W, and a plurality of electronic components 20 may be disposed on the wafer W. The electronic components 20 may include electrical terminals 20T such as conductive pads on an active surface 20A. A passivation layer 22 may be formed on the active surface 20A. The passivation layer 22 exposes the electrical terminals 20T. In some arrangements, a back side of the wafer W can be thinned by grinding to reduce the thickness of the wafer W.

Figure 4B:
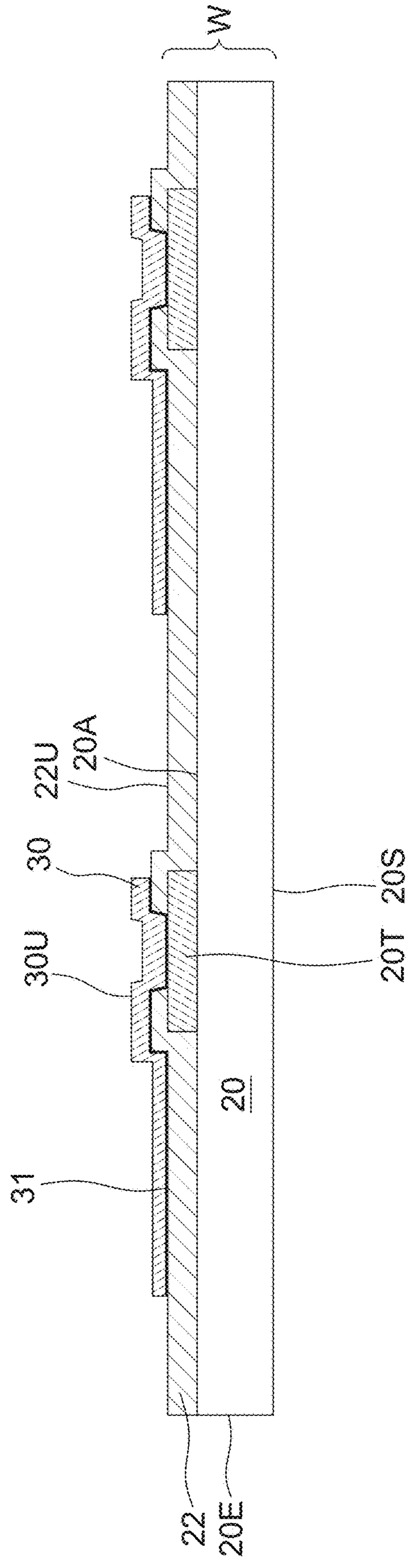

As shown in FIG. 4B, a conductive layer is formed on the electronic components 20, and the conductive layer is patterned. By way of example, the patterned conductive layer includes an RDL 30 formed on the active surface 20A of the wafer W. The RDL 30 is electrically connected to the electronic components 20 through the electrical terminals 20T. In some arrangements, a seed layer 31 may be formed on the passivation layer 22 and the electrical terminals 20T, and configured to grow the RDL 30. For example, the seed layer 31 may be a Ti/Cu layer formed by physical vapor deposition (PVD), and the RDL 30 may be a Cu layer formed by electroplating. The pattern of the RDL 30 may be defined by photolithography technique.

Figure 4C:
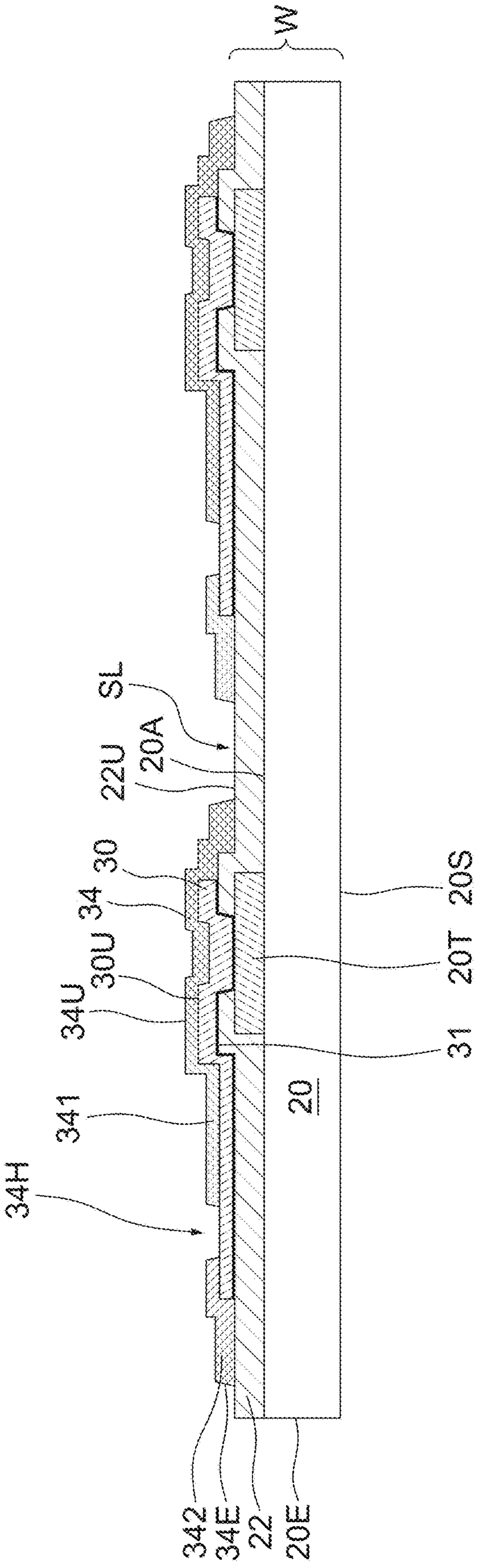

As shown in FIG. 4C, an interlayer 34 is formed on the RDL 30. The interlayer 34 includes a plurality of openings 34H partially exposing the RDL 30. In some arrangements, the material of the interlayer 34 may include photo curable dielectric material such as polyimide. The interlayer 34 can be formed by spinning coating the polyimide layer on the electronic components 20. The polyimide layer can be patterned by photolithography process to form the openings 34H. The sidewall 34S may include a curved surface and the upper surface 34U of the interlayer 34 may form the protrusion 34P after the photolithography process. In some arrangements, scribe lines SL can be formed in the interlayer 34 along with formation of the openings 34H. The scribe lines SL make the edge 34E of the interlayer 34 recessed from the edge 20E of the electronic component 20, and exposes the upper surface 22U of the passivation layer 22. The edge 34E of the interlayer 34 may include a curved surface such as a concaved curved surface.

Figure 4D:
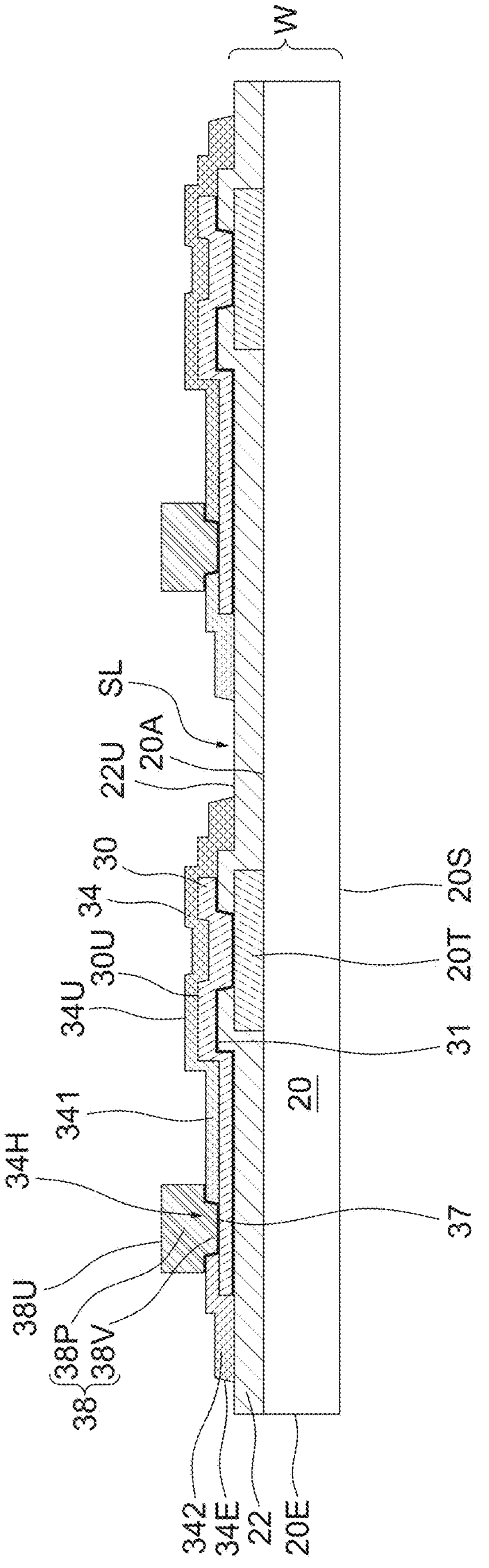

As shown in FIG. 4D, a plurality of interconnection structures 38 are formed in the openings 34H of the interlayer 34. The interconnection structures 38 are electrically connected to the RDL 30 through the openings 34H. In some arrangements, a seed layer 37 may be formed on the interlayer 34 and the RDL 30, and configured to grow the interconnection structures 38. For example, the seed layer 37 may be a Ti/Cu layer formed by PVD, and the interconnection structures 38 may be a Cu layer formed by electroplating. The pattern of the interconnection structures 38 may be defined by photolithography technique.

Figure 4E:
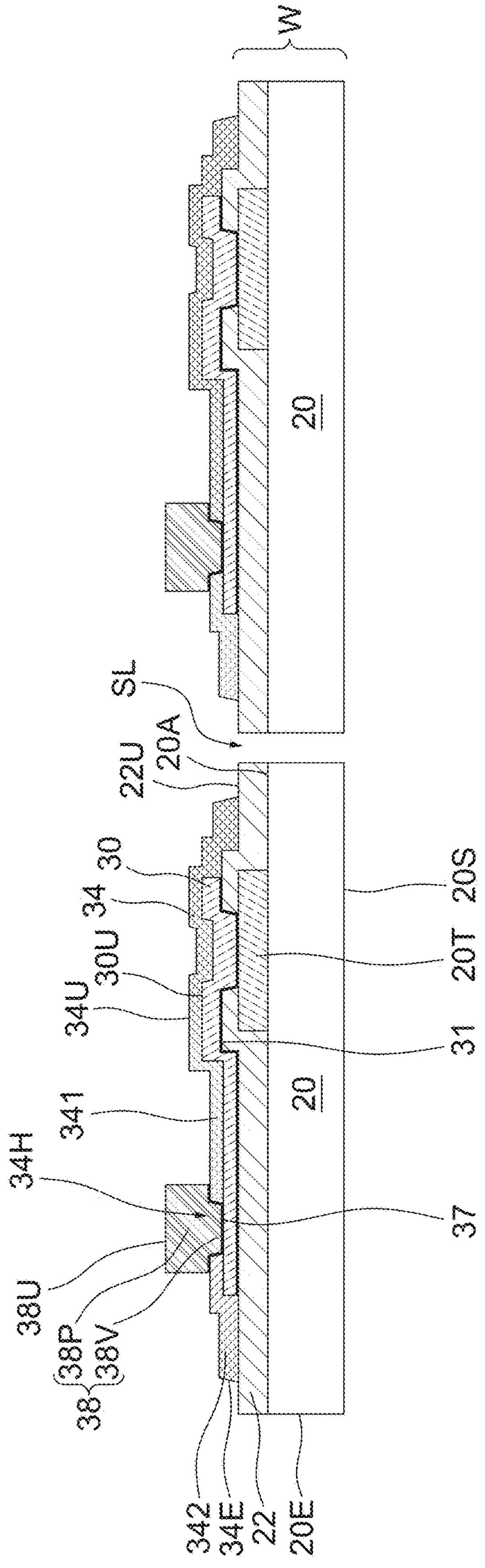
Figure 4F:
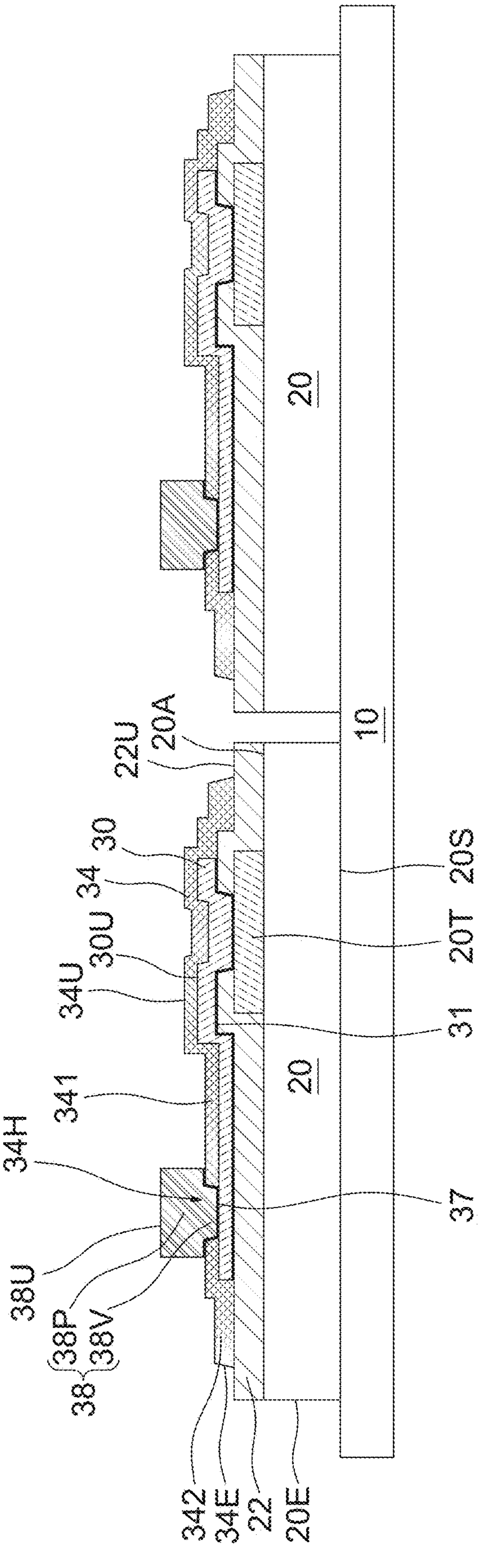

As shown in FIG. 4E, the plurality of electronic components 20 are singulated through the scribe lines SL. As shown in FIG. 4F, the singulated electronic components 20 are reconstructed on a carrier 10 such as a tape.

Figure 4G:
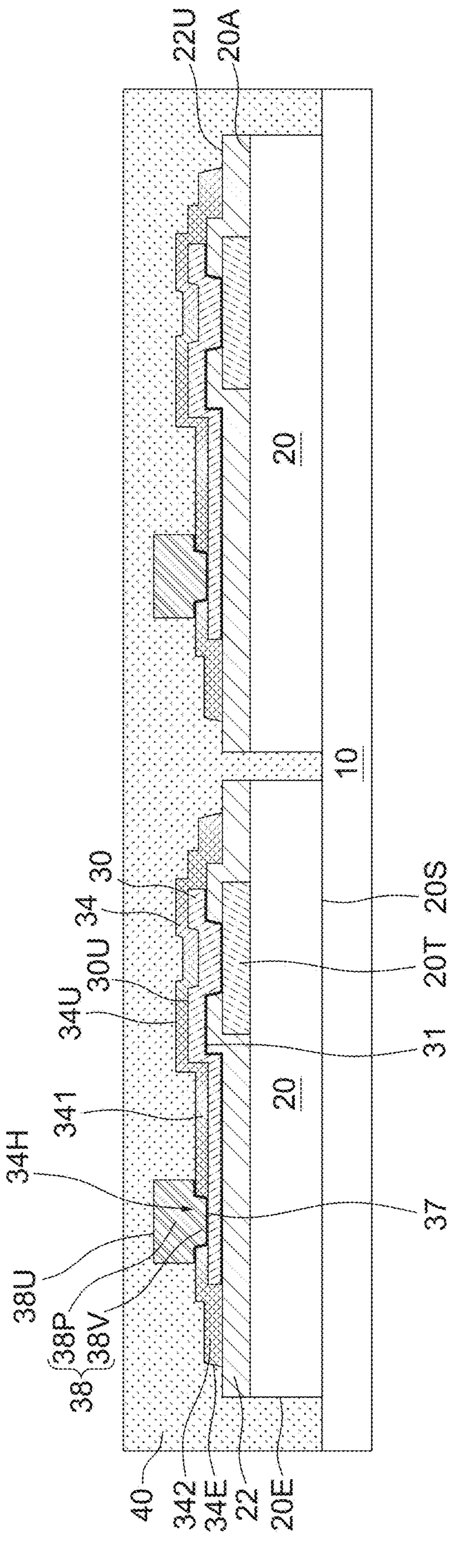

As shown in FIG. 4G, an encapsulation layer 40 is formed to encapsulate the singulated electronic components 20. The encapsulation layer 40 is filled in the scribe lines SL and encapsulates the edge 34E of the interlayer 34 and the edge 20E of the electronic component 20. The encapsulation layer 40 may include a molding material 40M and fillers 40F dispersed in the molding material 40M. The encapsulation layer 40 can, but is not limited to, be formed by thermal compression.

Figure 4H:
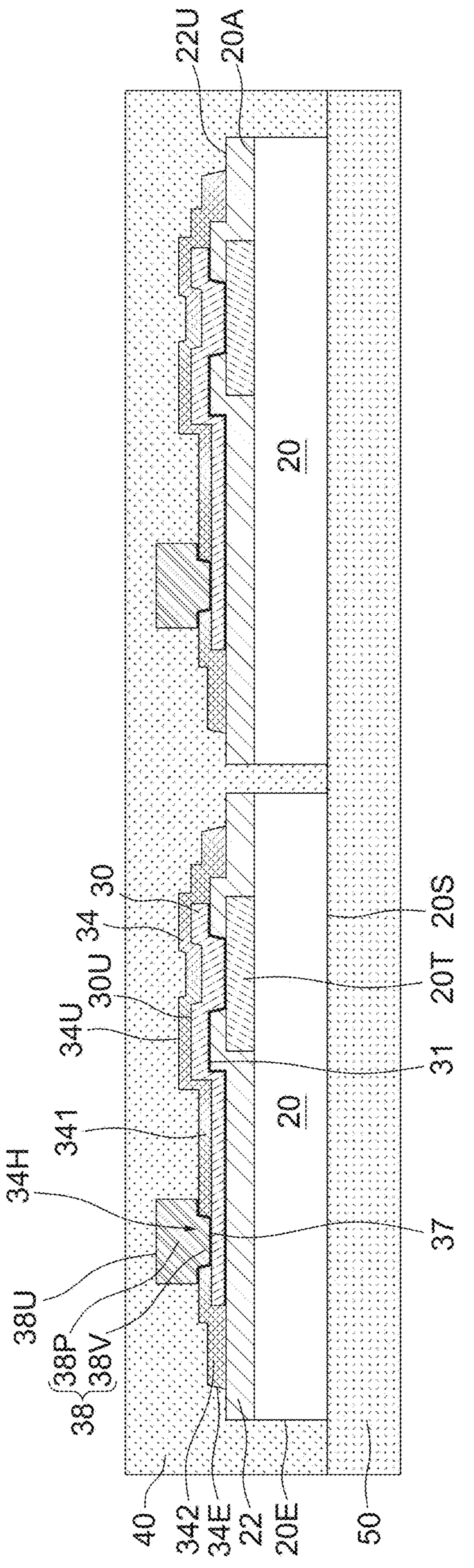

As shown in FIG. 4H, the carrier 10 is removed from the opposing surfaces 20S of the singulated electronic components 20. A light shielding layer 50 is formed on the opposing surfaces 20S of the singulated electronic components 20. The light shielding layer 50 may include a molding material 50M and fillers 50F dispersed in the molding material 50M. The light shielding layer 50 can, but is not limited to, be formed by thermal compression.

Figure 4I:
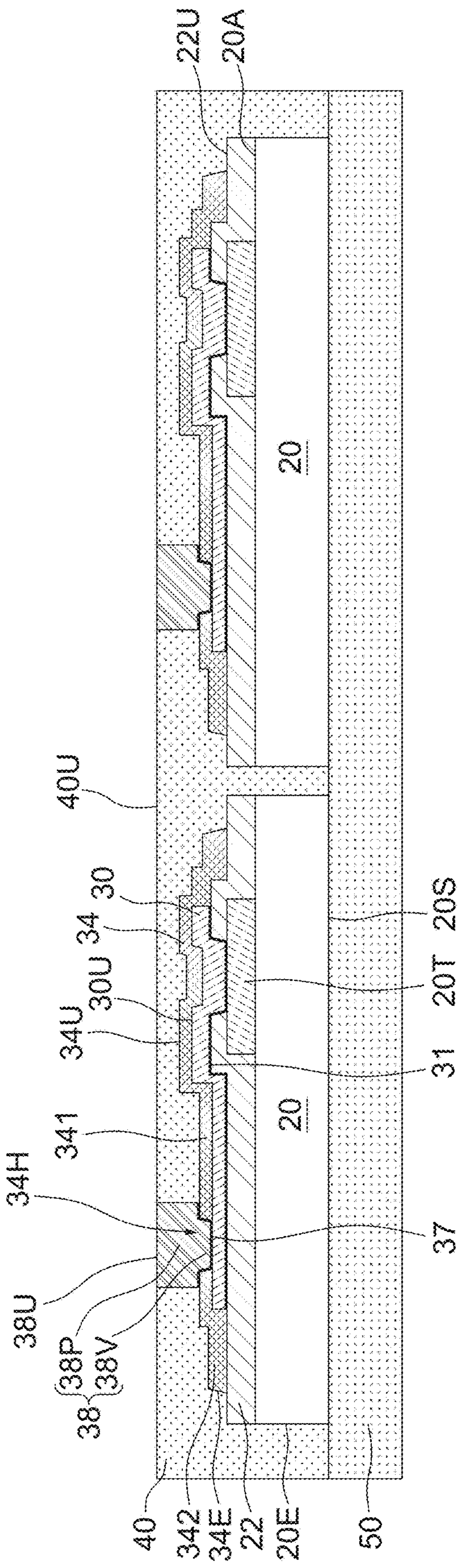
Figure 4J:
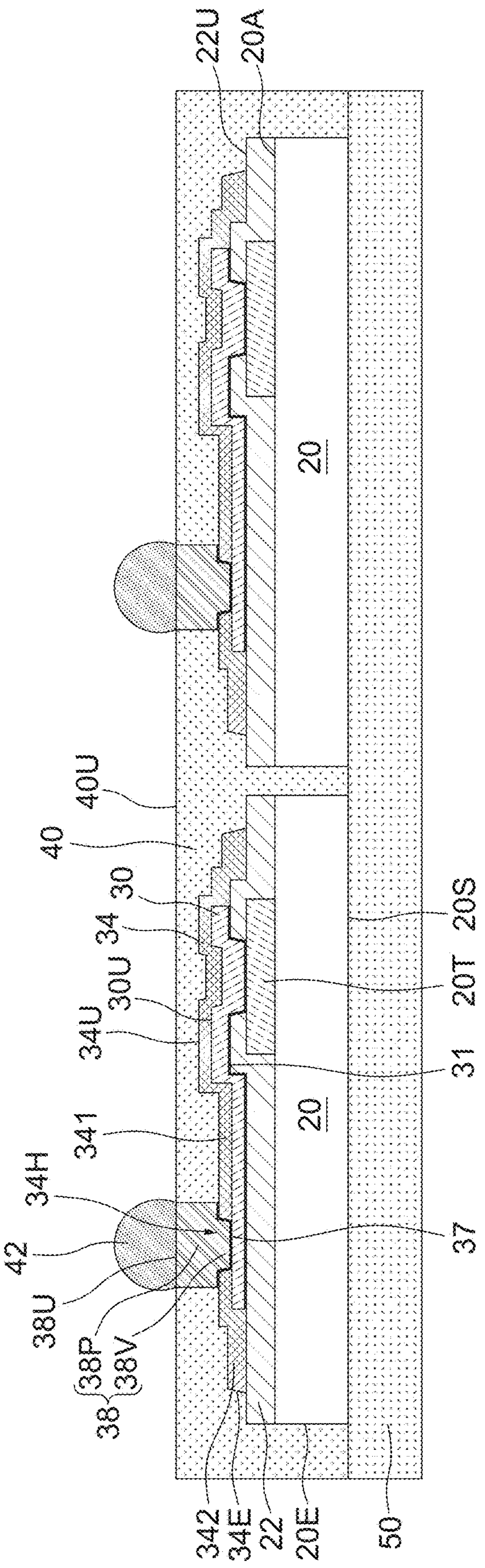
Figure 4K:
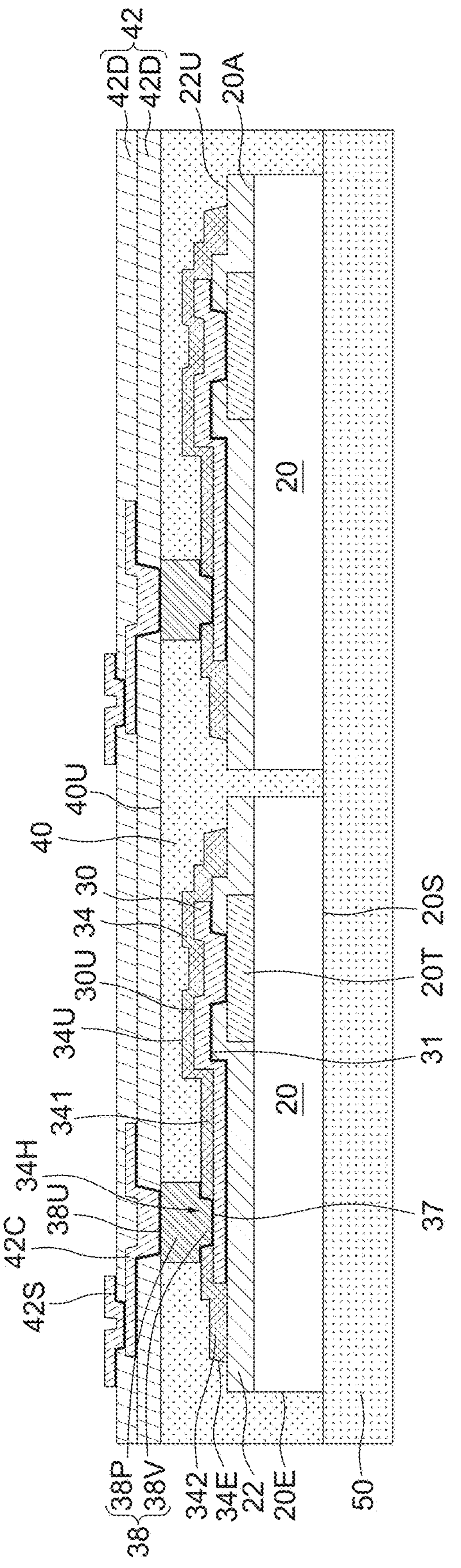

As shown in FIG. 4I, the encapsulation layer 40 is partially removed by e.g., grinding to expose the interconnection structures 38. As shown in FIG. 4J, a plurality of electrical conductor 42 such as solder balls are formed on the interconnection structures 38. The encapsulation layer 40 and the light shielding layer 50 are then singulated to form the electronic device package 1 as illustrated in FIGS. 1, 1A, 1B and 1C.

In some other arrangements, one or more conductive layers 42C and one or more dielectric layers 42D may be formed on the interconnection structures 38 to form the electronic device package 2 as illustrated in FIG. 2.

In some arrangements of the present disclosure, the interlayer (e.g., a buffer layer) is disposed between the RDL/the interconnection structure made of metal such as copper and the encapsulation layer made of molding compound. The interlayer (or the buffer layer) is configured to (e.g., shaped to, sized to, and/or is formed of a material for) alleviate delamination between the encapsulation layer and the RDL and/or the interconnection structure and the encapsulation layer due to stress such as thermal stress during thermal cycle test. Accordingly, delamination can be reduced. All six sides of the electronic component is blocked by the encapsulation layer and the light shielding layer, and thus the electronic component can be free from being influenced by undesired energy beam such as IR beam.

In the description of some arrangements, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific arrangements thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device package, comprising:

an electronic component including an active surface;

an interconnection structure disposed over the active surface;

an encapsulation layer encapsulating the interconnection structure; and a dielectric layer disposed between the interconnection structure and the encapsulation layer, wherein the dielectric layer comprises a first indentation surface recessed from a top surface of the dielectric layer, the encapsulation layer extends into the first indentation surface of the dielectric layer, and the interconnection structure comprises a via portion within the dielectric layer a pad portion over the via portion and protruded beyond the top surface and horizontally overlapping a portion of the dielectric layer.

2. The electronic device package of claim 1, further comprising a solder ball disposed on the pad portion of the interconnection structure.

3. The electronic device package of claim 2, wherein the solder ball overlaps the encapsulation layer in a direction substantially perpendicular to the active surface of the electronic component.

4. The electronic device package of claim 1, further comprising a patterned conductive layer, wherein the dielectric layer is disposed between the patterned conductive layer and the interconnection structure.

5. The electronic device package of claim 4, wherein the patterned conductive layer comprises a second indentation surface recessed from a top surface of the patterned conductive layer, and the first indentation surface is directly over the second indentation surface.

6. The electronic device package of claim 5 wherein the encapsulation layer comprises a filler contacting the first indentation surface of the dielectric layer.

7. The electronic device package of claim 5, wherein the encapsulation layer contacts a lateral surface of the dielectric layer.

8. The electronic device package of claim 7, wherein the encapsulation layer contacts an edge of the electronic component.

9. An electronic device package, comprising:

an electronic component including an active surface;

a patterned conductive layer disposed on the active surface;

a dielectric layer encapsulating the patterned conductive layer; and a passivation layer disposed between the dielectric layer and the active surface of the electronic component, wherein the passivation layer includes an upper surface partially exposed by the dielectric layer, and an edge and an upper surface of the dielectric layer and the upper surface of the passivation layer collectively define a step, and wherein the edge of the dielectric layer is recessed from an edge of the passivation layer by a first distance in a direction substantially parallel to the active surface of the electronic component, and the patterned conductive layer has a thickness less than the first distance.

10. The electronic device package of claim 9, wherein a bottom portion of the edge of the dielectric layer is closer to the passivation layer than an upper portion of the edge is, and the bottom portion of the edge is wider than the upper portion of the edge in a cross-sectional view perspective.

11. The electronic device package of claim 10, wherein the edge of the dielectric layer comprises a lateral surface, and the lateral surface comprises a curved surface.

12. The electronic device package of claim 11, wherein the curved surface is a concaved curved surface.

13. The electronic device package of claim 9, further comprising an encapsulation layer including a first portion encapsulating the active surface and an edge of the electronic component.

14. The electronic device package of claim 13, wherein the encapsulation layer further comprises a second portion encapsulating a bottom surface of the electronic component and a bottom surface of the first portion.

15. An electronic device package, comprising:

an electronic component including an active surface;

a redistribution layer (RDL) disposed on the active surface;

an encapsulation layer disposed on the RDL;

a dielectric layer disposed between the RDL and the encapsulation layer; and an interconnection structure disposed on the RDL, wherein the interconnection structure passes through the dielectric layer, the dielectric layer further extends between the interconnection structure and the RDL, the encapsulation layer encapsulates the interconnection structure, and a surface of the interconnection structure is substantially aligned with a surface of the encapsulation layer.

16. The electronic device package of claim 15, wherein a portion of the dielectric layer is below the interconnection structure and has a non-uniform thickness.

17. The electronic device package of claim 16, wherein the dielectric layer defines an opening having a profile tapering in a direction from the interconnection structure toward the RDL.

18. The electronic device package of claim 16, wherein an opening is defined by a curved sidewall of the dielectric layer.

19. The electronic device package of claim 18, wherein the portion of the dielectric layer further defines a curved upper surface connected to the curved sidewall.

20. The electronic device package of claim 15, wherein the dielectric layer tapers in a direction away from the active surface of the electronic component.

* * * * *